United States Patent
Yu et al.

(10) Patent No.: US 11,705,504 B2
(45) Date of Patent: Jul. 18, 2023

(54) STACKED NANOSHEET TRANSISTOR WITH DEFECT FREE CHANNEL

(71) Applicant: International Business Machines Corporation, Armonk, NY (US)

(72) Inventors: Lan Yu, Voorheesville, NY (US); Kangguo Cheng, Schenectady, NY (US); Heng Wu, Guilderland, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/540,315

(22) Filed: Dec. 2, 2021

(65) Prior Publication Data
US 2023/0178632 A1    Jun. 8, 2023

(51) Int. Cl.
| | |
|---|---|
| *H01L 29/66* | (2006.01) |
| *H01L 29/06* | (2006.01) |
| *H01L 29/08* | (2006.01) |
| *H01L 29/786* | (2006.01) |
| *H01L 29/423* | (2006.01) |

(52) U.S. Cl.
CPC .... *H01L 29/66545* (2013.01); *H01L 29/0673* (2013.01); *H01L 29/0847* (2013.01); *H01L 29/42392* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 9,224,811 | B2 | 12/2015 | Cheng et al. |
| 9,461,114 | B2 | 10/2016 | Obradovic et al. |
| 9,711,414 | B2 | 7/2017 | Hatcher et al. |
| 10,297,664 | B2 | 5/2019 | Xie |
| 10,741,558 | B2 | 8/2020 | Chiang et al. |
| 2017/0040321 | A1 | 2/2017 | Mitard |

(Continued)

FOREIGN PATENT DOCUMENTS

WO    2015190852 A1    12/2015

OTHER PUBLICATIONS

International Search Report and Written Opinion for International Application No. PCT/CN2022/134540; International Filing Date: Nov. 28, 2022; dated Feb. 20, 2023; 7 pages.

(Continued)

*Primary Examiner* — Nilufa Rahim
(74) *Attorney, Agent, or Firm* — Cantor Colburn LLP; Samuel Waldbaum

(57) ABSTRACT

Embodiments of the present invention are directed to methods and resulting structures for nanosheet devices having defect free channels. In a non-limiting embodiment of the invention, a nanosheet stack is formed over a substrate. The nanosheet stack includes alternating first sacrificial layers and second sacrificial layers. One layer of the first sacrificial layers has a greater thickness than the remaining first sacrificial layers. The first sacrificial layers are removed and semiconductor layers are formed on surfaces of the second sacrificial layers. The semiconductor layers include a first set and a second set of semiconductor layers. The second sacrificial layers are removed and an isolation dielectric is formed between the first set and the second set of semiconductor layers.

15 Claims, 15 Drawing Sheets

(56) References Cited

U.S. PATENT DOCUMENTS

| | | | |
|---|---|---|---|
| 2018/0308986 A1* | 10/2018 | Chao | H01L 29/78603 |
| 2019/0131394 A1 | 5/2019 | Reznicek et al. | |
| 2019/0288004 A1 | 9/2019 | Smith et al. | |
| 2020/0006479 A1* | 1/2020 | Reznicek | H01L 29/42392 |
| 2020/0118891 A1* | 4/2020 | Cheng | H01L 27/1203 |
| 2020/0235098 A1 | 7/2020 | Li et al. | |
| 2020/0303502 A1 | 9/2020 | Bomberger et al. | |
| 2021/0104522 A1* | 4/2021 | Gardner | H01L 27/0688 |
| 2022/0199799 A1* | 6/2022 | O'Brien | H01L 29/7782 |
| 2022/0384576 A1* | 12/2022 | Yu | H01L 29/1083 |
| 2023/0086084 A1* | 3/2023 | Yun | H01L 21/823481 |
| | | | 257/401 |

OTHER PUBLICATIONS

Agha et al., "Review of Nanosheet Transistors Technology", https://www.researchgate.net/publication/351590703_Review_of_Nanosheet_Transistors_Technology. May 2021. 9 Pages.

\* cited by examiner

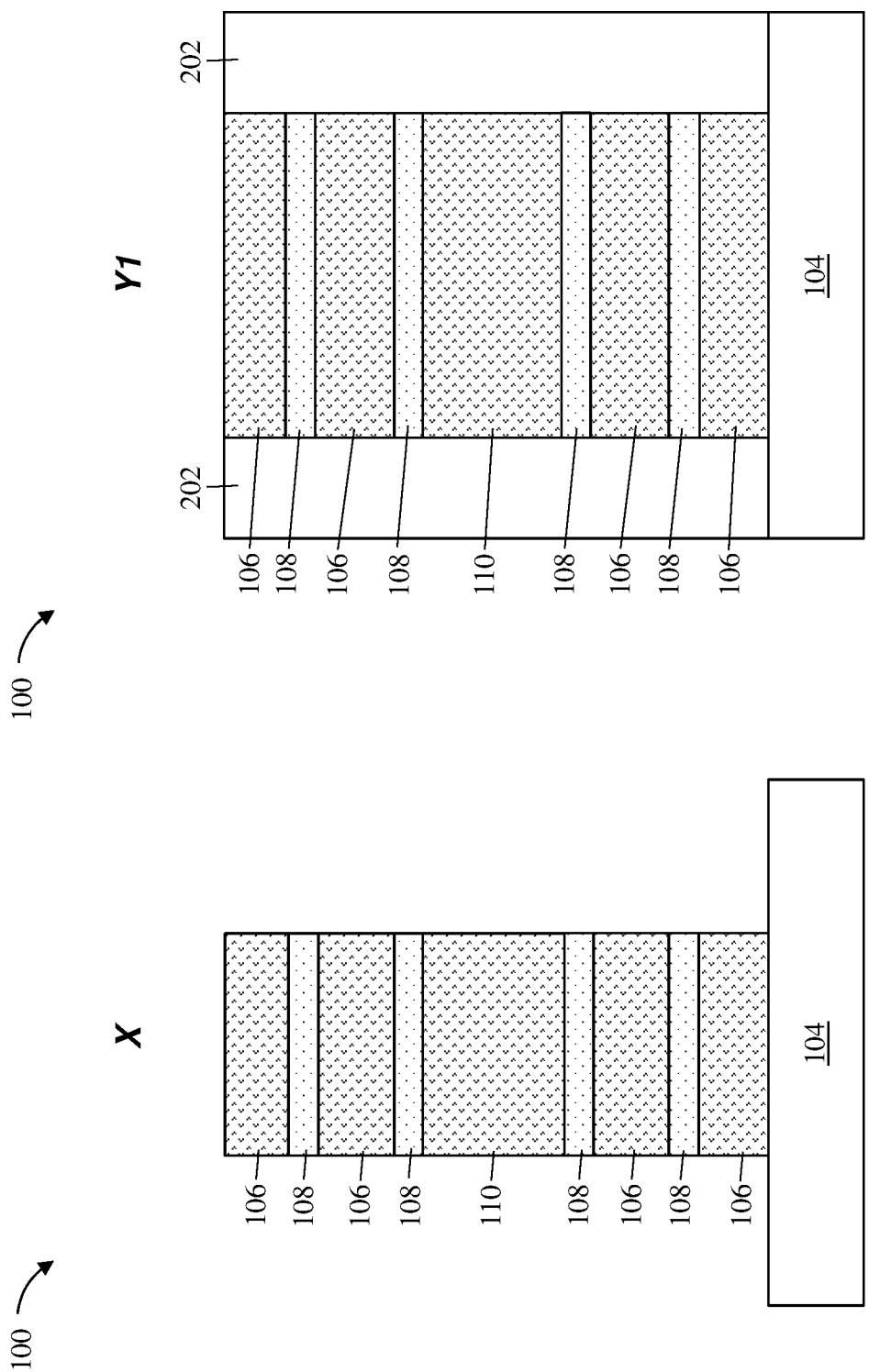

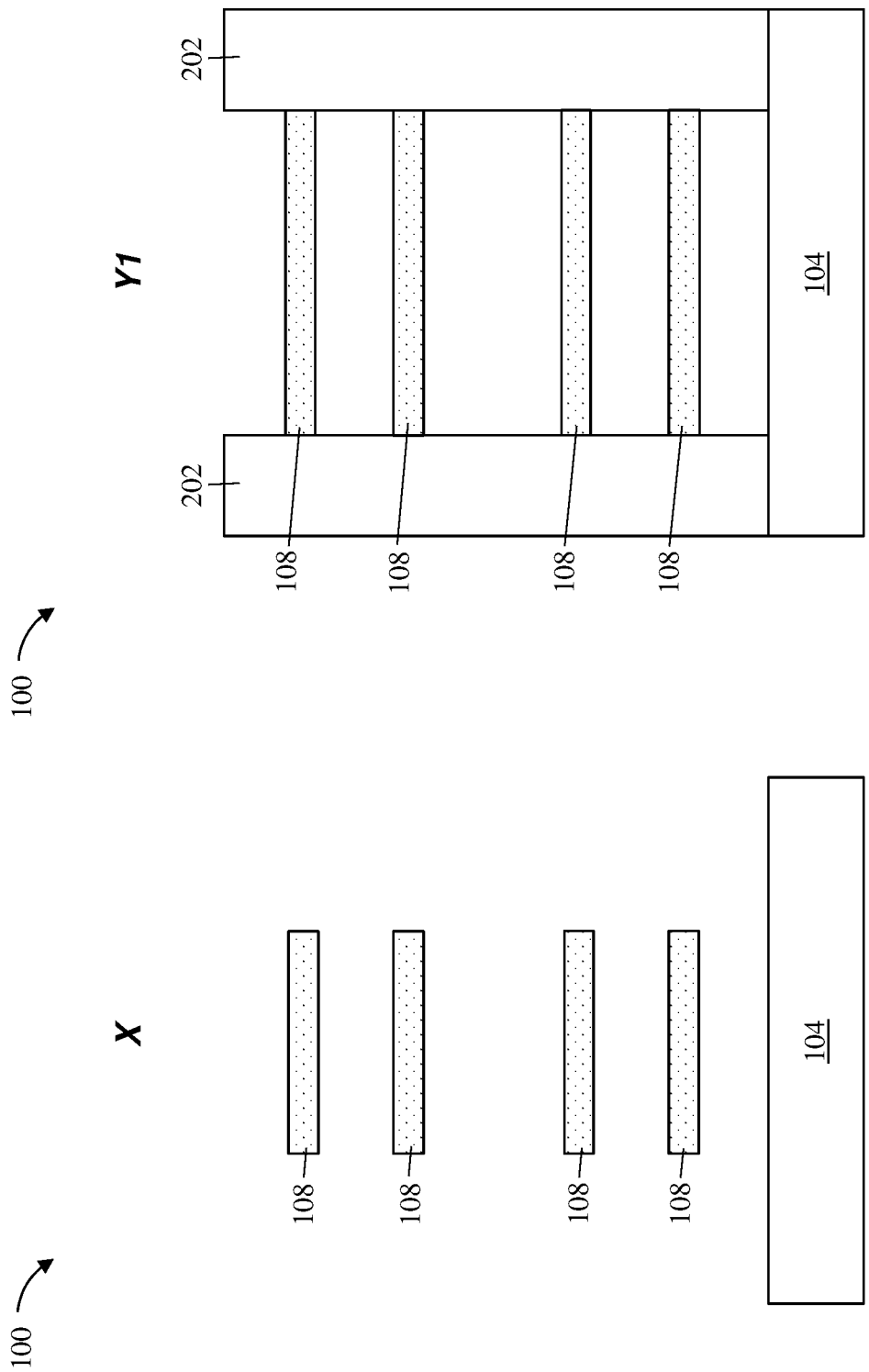

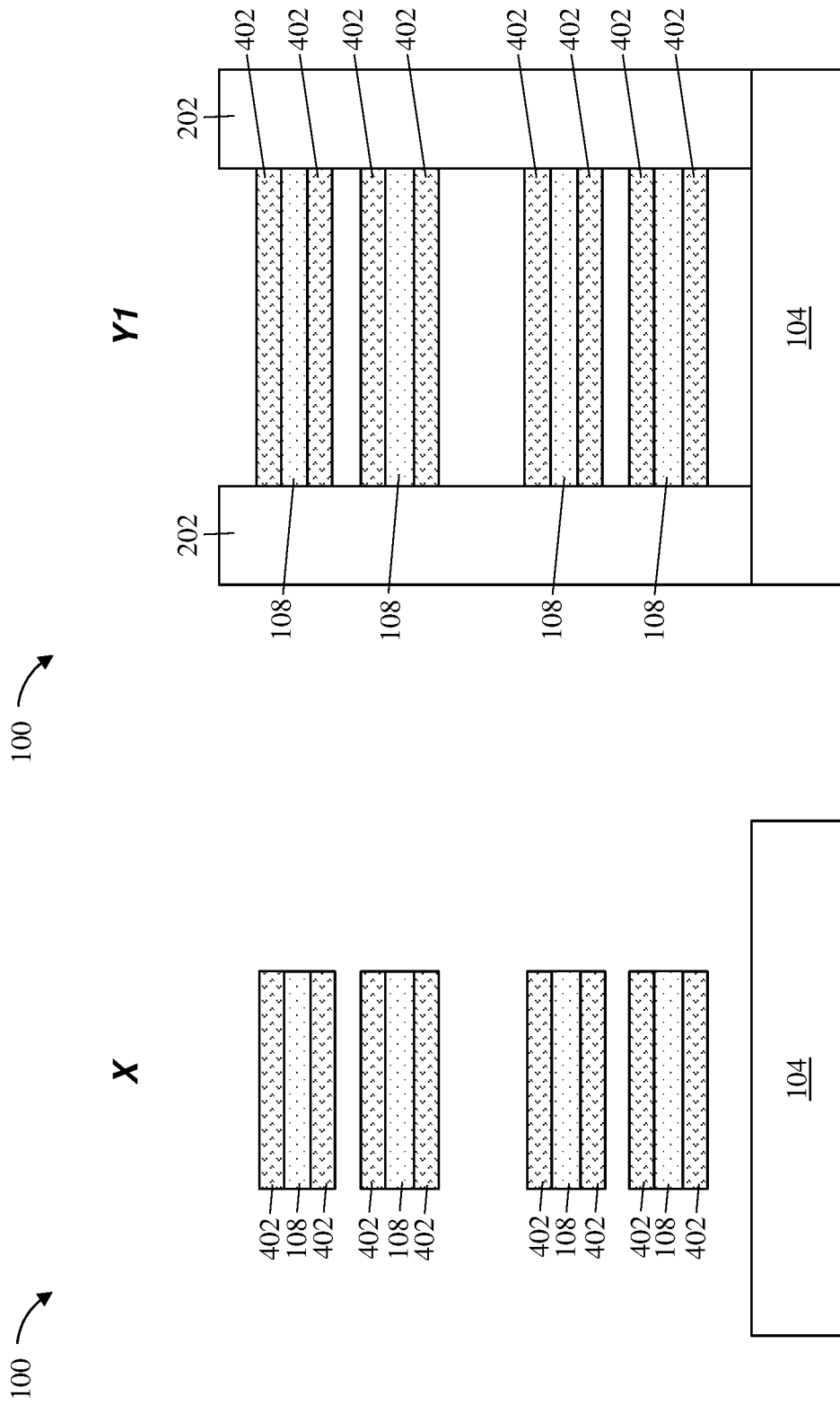

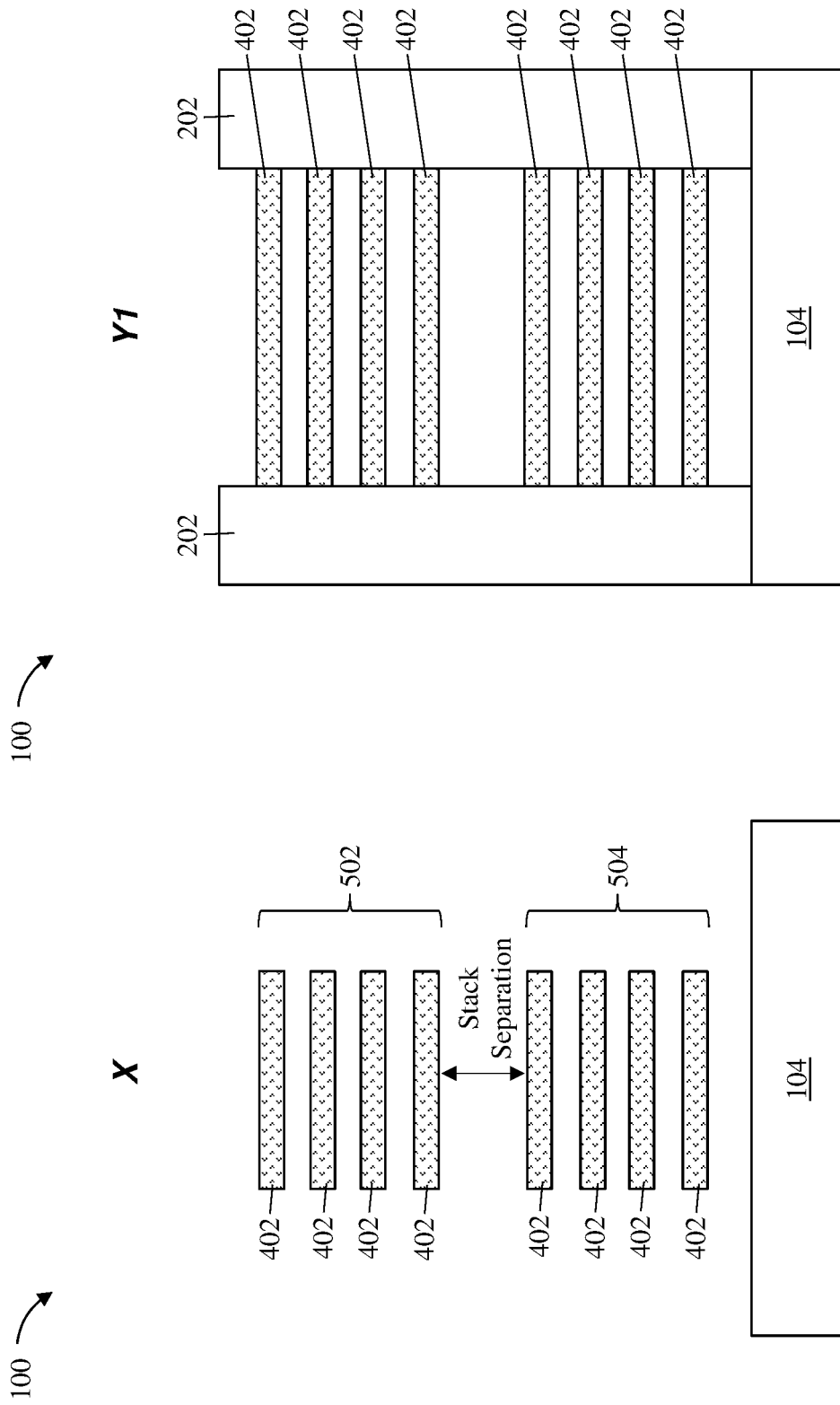

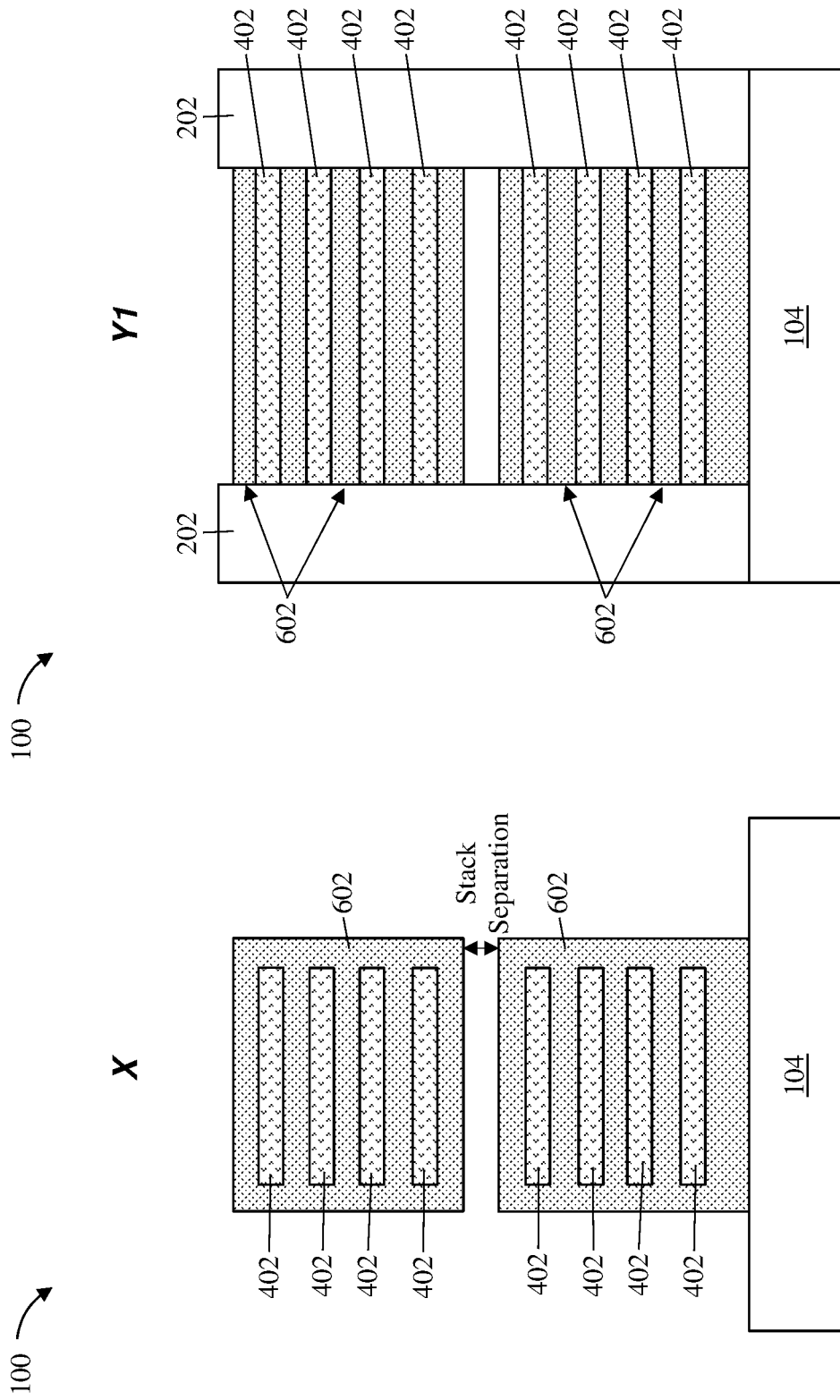

STACKED NANOSHEET TRANSISTOR WITH DEFECT FREE CHANNEL

BACKGROUND

The present invention generally relates to fabrication methods and resulting structures for semiconductor devices, and more specifically, to an improved fabrication methods and resulting structures for nanosheet transistors having defect free channels.

Known metal oxide semiconductor field effect transistor (MOSFET) fabrication techniques include process flows for constructing planar field effect transistors (FETs). A planar FET includes a substrate (also referred to as a silicon slab); a gate formed over the substrate; source and drain regions formed on opposite ends of the gate; and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. For example, nanosheet FETs include a non-planar architecture that provides increased device density and some increased performance over lateral devices. In nanosheet FETs, in contrast to conventional planar FETs, the channel is implemented as a plurality of stacked and spaced apart nanosheets. The gate stack wraps around the full perimeter of each nanosheet, thus enabling fuller depletion in the channel region, and also reducing short-channel effects due to steeper subthreshold swing (SS) and smaller drain induced barrier lowering (DIBL).

SUMMARY

Embodiments of the invention are directed to a method for forming nanosheet transistors having defect free channels. A non-limiting example of the method includes forming a nanosheet stack over a substrate. The nanosheet stack includes alternating first sacrificial layers and second sacrificial layers. One layer of the first sacrificial layers has a greater thickness than the remaining first sacrificial layers. The first sacrificial layers are removed and semiconductor layers are formed on surfaces of the second sacrificial layers. The semiconductor layers include a first set and a second set of semiconductor layers. The second sacrificial layers are removed and an isolation dielectric is formed between the first set and the second set of semiconductor layers.

Embodiments of the invention are directed to a semiconductor structure. A non-limiting example of the semiconductor structure includes a nanosheet stack over a substrate. The nanosheet stack includes a first set of semiconductor layers and a second set of semiconductor layers. An isolation dielectric is positioned between the first set of semiconductor layers and the second set of semiconductor layers. First source and drain regions are formed on sidewalls of the first set of semiconductor layers and second source and drain regions are formed on sidewalls of the second set of semiconductor layers. The first source and drain regions include a first dopant type and the second source and drain regions include a second dopant type. Bottom source and drain contacts are formed on sidewalls of the first source and drain regions and top source and drain contacts are formed on a top surface of the second source and drain regions.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2A depicts a cross-sectional view of a semiconductor structure along the line X of the reference view according to one or more embodiments of the invention;

FIG. 2B depicts a cross-sectional view of a semiconductor structure along the line Y1 of the reference view according to one or more embodiments of the invention;

FIG. 3A depicts a cross-sectional view of a semiconductor structure along the line X of the reference view according to one or more embodiments of the invention;

FIG. 3B depicts a cross-sectional view of a semiconductor structure along the line Y1 of the reference view according to one or more embodiments of the invention;

FIG. 4A depicts a cross-sectional view of a semiconductor structure along the line X of the reference view according to one or more embodiments of the invention;

FIG. 4B depicts a cross-sectional view of a semiconductor structure along the line Y1 of the reference view according to one or more embodiments of the invention;

FIG. 5A depicts a cross-sectional view of a semiconductor structure along the line X of the reference view according to one or more embodiments of the invention;

FIG. 5B depicts a cross-sectional view of a semiconductor structure along the line Y1 of the reference view according to one or more embodiments of the invention;

FIG. 6A depicts a cross-sectional view of a semiconductor structure along the line X of the reference view according to one or more embodiments of the invention;

FIG. 6B depicts a cross-sectional view of a semiconductor structure along the line Y1 of the reference view according to one or more embodiments of the invention;

Figure 1:
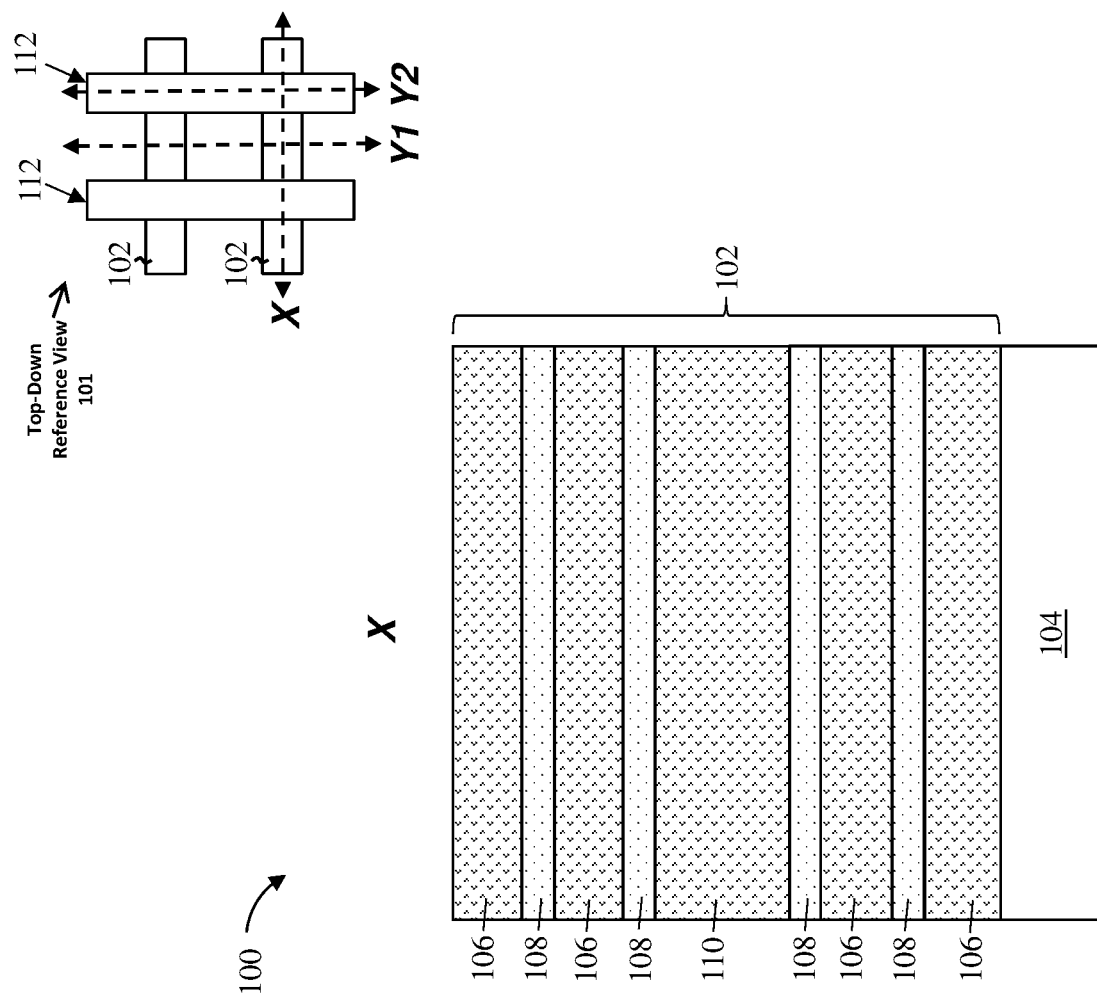
FIG. 1 depicts a top-down reference view, along with a cross-sectional view of a semiconductor structure along the line X of the reference view after an initial set of processing operations according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, there are a few candidates for scaling nonplanar transistors beyond the 7 nm node, but each is currently limited due to various factors. One candidate is the nanosheet transistor architecture. To increase the available computing power per unit area, nanosheet devices vertically stack channels over a shared substrate footprint.

Currently for nanosheet devices, each channel is predefined in the initial stages of fabrication by alternatively growing silicon and silicon germanium layers (Si/SiGe layers). One of the Si or SiGe layers are sacrificial layers that are removed to expose the surface of the remaining layers, which define the channels. However, due to the requirement of selective removal between the two materials (Si vs. SiGe), the minimal germanium percentage used is roughly 25% (at lower Ge % removal selectivity between Si and SiGe degrades). At this germanium concentration, the bulk critical thickness for a stable SiGe film epitaxially grown on Si is 10 nm; below this thickness (sometimes referred to as the critical thickness), the Si/SiGe can remain defect-free; beyond this thickness (critical thickness) defects can form and become pervasive. This puts a practical limitation on the maximum nanosheet stack height and, ultimately, computing power and performance. Consequently, fabricating stacked nanosheet devices having arbitrary heights with defect free channels using conventional nanosheet fabrication processes is difficult if not impossible.

Turning now to an overview of aspects of the present invention, one or more embodiments of the invention address the above-described shortcomings of known nanosheet architectures and fabrication techniques by providing a new nanosheet structure and a method of fabricating the same that ensures a defect-free channel for any number of channels at arbitrary stack heights. In accordance with embodiments of the invention, a new nanosheet fabrication technique is leveraged whereby all of the initial Si and SiGe layers are sacrificial layers. The final channel is grown later, after removing the silicon germanium sacrificial layers, on defect-free silicon layers.

A nanosheet structure formed in this manner offers several technical benefits over conventional nanosheets. For example, the thickness of the SiGe layers can be kept within the critical dimension threshold without sacrificing the total number of channels or channel height, and without introducing defects into the stack. By ensuring a defect-free channel, the proposed structure does not compromise device performance scaling, as more channel layers can be included in the structure. This in turn provides a way to further increase bits/area for future technology nodes.

Turning now to a more detailed description of fabrication operations and resulting structures according to aspects of the invention, FIGS. 1-14 depict a semiconductor structure 100 after various fabrication operations in accordance with aspects of the invention. Although the cross-sectional diagrams depicted in FIGS. 1-14 are two-dimensional, it is understood that the diagrams depicted in FIGS. 1-14 represent three-dimensional structures. The top-down reference view 101 shown in FIG. 1 provides a reference point for the various cross-sectional views: X-view (across gate in channel region), Y1-view (along gates in channel region), and Y2-view (along gates in source/drain region) shown in FIGS. 1-14.

FIG. 1 depicts cross-sectional views of the semiconductor structure 100 taken along the line X of the reference view 101 after an initial set of fabrication operations have been applied as part of a method of fabricating a final semiconductor device according to one or more embodiments of the invention. In some embodiments of the invention, one or more nanosheet stacks 102 are formed over a substrate 104.

The substrate 104 can be made of any suitable substrate material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlInAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments of the invention, the substrate 104 can include a buried oxide layer (not separately shown) in a silicon-on-insulator (SOI) configuration. The buried oxide layer can be made of any suitable dielectric material, such as, for example, a silicon oxide. In some embodiments of the invention, the buried oxide layer is formed to a thickness of about 10-200 nm, although other thicknesses are within the contemplated scope of the invention. In some embodiments of the invention, the semiconductor structure 100 can also be formed without the buried oxide layer. In that case, an STI (shallow trench isolation) will be formed to isolate device from device.

In some embodiments of the invention, each of the nanosheet stacks 102 can include one or more first sacrificial layers 106 alternating with one or more second sacrificial layers 108. In some embodiments of the invention, one of the first sacrificial layers 106 is formed or grown to a greater thickness than the remaining first sacrificial layers 106, defining a thick sacrificial layer 110. In some embodiments of the invention, the thick sacrificial layer 110 is grown from the middle-most layer of the first sacrificial layers 106 (as shown), although other relative positionings are possible. The inclusion of the thick sacrificial layer 110 allows for later separation between the channels of two stacked FETs (discussed in further detail later with respect to FIG. 5A).

In some embodiments of the invention, the first sacrificial layers 106 and the second sacrificial layers 108 are epitaxially grown layers. For ease of discussion reference is made to operations performed on and to a nanosheet stack having four first sacrificial layers 106, four second sacrificial layers 108, and a thick sacrificial layer 110. It is understood, however, that the nanosheet stacks 102 can include any number of semiconductor layers alternating with a corresponding number of sacrificial layers and may or may not include a thick semiconductor layer. For example, the nanosheet stacks 102 can include two semiconductor layers, five semiconductor layers, eight semiconductor layers, 30 semiconductor layers, or any number of semiconductor layers, along with a corresponding number of sacrificial layers (i.e., in an alternating fashion while allowing for a thick semiconductor layer if present).

The first sacrificial layers 106 (and the thick sacrificial layer 110) can be made of any suitable material such as, for example, monocrystalline silicon. Alternative materials are possible, so long as the material offers etch selectivity with respect to silicon germanium and can be deposited or grown to the needed heights without introducing defects. In some embodiments of the invention, the first sacrificial layers 106 have a thickness of about 4 nm to about 10 nm, for example 6 nm, although other thicknesses are within the contemplated scope of the invention. In some embodiments of the invention, the thick sacrificial layer 110 has a thickness of about 10 nm to about 50 nm, for example 25 nm, although other thicknesses are within the contemplated scope of the invention. In some embodiments of the invention, the substrate 104 and the first sacrificial layers 106 can be made of a same semiconductor material. In other embodiments of the invention, the substrate 104 can be made of a first semiconductor material, and the first sacrificial layers 106 can be made of a second semiconductor material. The thick sacrificial layer 110 can be of a same or different material than the first sacrificial layers 106. In some embodiments, the bottommost layer of the sacrificial layers 106 can be the silicon layer on a starting silicon-on-insulator (SOI) substrate.

In some embodiments of the invention, the second sacrificial layers 108 are silicon germanium layers having a germanium concentration that is greater than the germanium concentration in the first sacrificial layers 106 (if present). For example, if the first sacrificial layers 106 are silicon germanium layers having a germanium concentration of 5 percent (sometimes referred to as SiGe5), the second sacrificial layers 108 can be silicon germanium layers having a germanium concentration of about 25 (SiGe25), although other germanium concentrations are within the contemplated scope of the invention. In embodiments where the first sacrificial layers 106 are silicon layers, the second sacrificial layers 108 can include silicon germanium layers having a germanium concentration of about 5% to about 60% germanium. Advantageously, the second sacrificial layers 108 have a maximum thickness below the critical thickness for SiGe defects, e.g., less than about 10 nm.

FIGS. 2A and 2B depict cross-sectional views of the semiconductor structure 100 taken along the lines X and Y1 of the reference view 101 after a processing operation according to one or more embodiments of the invention. As shown in the cross-sectional view X of FIG. 2A, portions of the nanosheet stacks 102 can be removed to expose a surface of the substrate 104 and to define the nanosheet stack width. This process is sometimes referred to as a fin cut. In some embodiments of the invention, the width of the nanosheet stacks 102 after the fin cut is about 10-100 nm, although other widths are within the contemplated scope of the invention.

As shown in FIG. 2B, a dielectric layer 202 is formed on each end of the nanosheet stacks 102 over the substrate 104. The dielectric layer 202 can be made of any suitable dielectric material, such as, for example, oxides, a low-k dielectric, nitrides, silicon nitride, silicon oxide, SiON, SiC, SiOCN, and SiBCN. Any known manner of forming the dielectric layer 202 can be utilized, such as, for example, CVD, PECVD, ALD, flowable CVD, spin-on dielectrics, or PVD.

FIGS. 3A and 3B depict cross-sectional views of the semiconductor structure 100 taken along the lines X and Y1 of the reference view 101 after a processing operation according to one or more embodiments of the invention. As shown in the cross-sectional view X of FIG. 3A, the first sacrificial layers 106 and the thick sacrificial layer 110 are removed to expose surfaces of the second sacrificial layers 108. In some embodiments of the invention, the first sacrificial layers 106 and the thick sacrificial layer 110 are removed selective to the second sacrificial layers 108. The first sacrificial layers 106 and the thick sacrificial layer 110 can be selectively removed using a wet etch, a dry etch, or a combination of wet and/or dry etches. For example, aqueous hydroxide chemistry, including ammonium hydroxide and potassium hydroxide, can be utilized to remove silicon selective to silicon germanium. As shown in FIG. 3B, the dielectric layer 202 on each end of the one or more nanosheet stacks 102 anchors each of the nanosheet stacks 102 over the substrate 104.

FIGS. 4A and 4B depict cross-sectional views of the semiconductor structure 100 taken along the lines X and Y1 of the reference view 101 after a processing operation according to one or more embodiments of the invention. As shown in the cross-sectional view X of FIG. 4A, semiconductor layers 402 (also referred to as channel layers) are formed on the exposed surfaces (top and bottom surfaces) of the second sacrificial layers 108. In some embodiments of the invention, the semiconductor layers 402 are epitaxially grown from the surfaces of the second sacrificial layers 108. As described previously, the thickness of the second sacrificial layers 108 can be kept below the critical thickness for defects, ensuring a defect-free surface from which the semiconductor layers 402 can be epitaxially grown.

The semiconductor layers 402 can be made of any suitable semiconductor material such as, for example, monocrystalline silicon or silicon germanium. Alternative materials are possible, so long as the material offers etch selectivity with respect to silicon germanium at the germanium concentration present in the second sacrificial layers 108. In some embodiments of the invention, the first sacrificial layers 106 have a thickness of about 4 nm to about 10 nm, for example 6 nm, although other thicknesses are within the contemplated scope of the invention. In some embodiments of the invention, the semiconductor layers 402, the substrate 104, and/or the first sacrificial layers 106 can be made of a same semiconductor material. In other embodiments of the invention, the semiconductor layers 402 are made of a different semiconductor material.

FIGS. 5A and 5B depict cross-sectional views of the semiconductor structure 100 taken along the lines X and Y1 of the reference view 101 after a processing operation according to one or more embodiments of the invention. As shown in the cross-sectional view X of FIG. 5A, the second sacrificial layers 108 are removed to expose surfaces of the semiconductor layers 402. In embodiments of the invention having a thick sacrificial layer 110, a first portion 502 of the semiconductor layers 402 are separated from a second portion 504 of the semiconductor layers 402 at a stack separation distance that can be increased or decreased by changing the thickness of the thick sacrificial layer 110 (see FIG. 2A).

In some embodiments of the invention, the second sacrificial layers 108 are removed selective to the semiconductor layers 402. The second sacrificial layers 108 can be selectively removed using a wet etch, a dry etch, or a combination of wet and/or dry etches. For example, hydrogen chloride (HCl) gas, or an aqueous solution containing a mix of ammonia and hydrogen peroxide, for example, can be utilized to remove silicon germanium selective to silicon. As shown in FIG. 5B, the dielectric layer 202 on each end of the semiconductor layers 402 anchors each of the semiconductor layers 402 of the nanosheet stacks 102 over the substrate 104.

FIGS. 6A and 6B depict cross-sectional views of the semiconductor structure 100 taken along the lines X and Y1 of the reference view 101 after a processing operation according to one or more embodiments of the invention. As shown in the cross-sectional view X of FIG. 6A, a dielectric layer 602 is formed over the exposed surfaces of the semiconductor layers 402. The stack separation distance is reduced by roughly twice the thickness of the dielectric layer 602 but is not eliminated entirely. This ensures room for an isolation dielectric formed later (see FIG. 7B).

The dielectric layer 602 can be made of any suitable dielectric material, such as, for example, oxides, a low-k dielectric, nitrides, silicon nitride, silicon oxide, SiON, SiC, SiOCN, and SiBCN. Any known manner of forming the dielectric layer 602 can be utilized, such as, for example, CVD, PECVD, and ALD. In some embodiments of the invention, the dielectric layer 602 is conformally deposited over the semiconductor layers 402, using, for example, ALD. In some embodiments of the invention, the dielectric layer 602 is an ALD silicon oxide layer. The dielectric layer 602 can be formed to a thickness of about 2 nm to about 15 nm, for example 5 nm, although other thicknesses are within the contemplated scope of the invention.

Figures 7A, 7B:
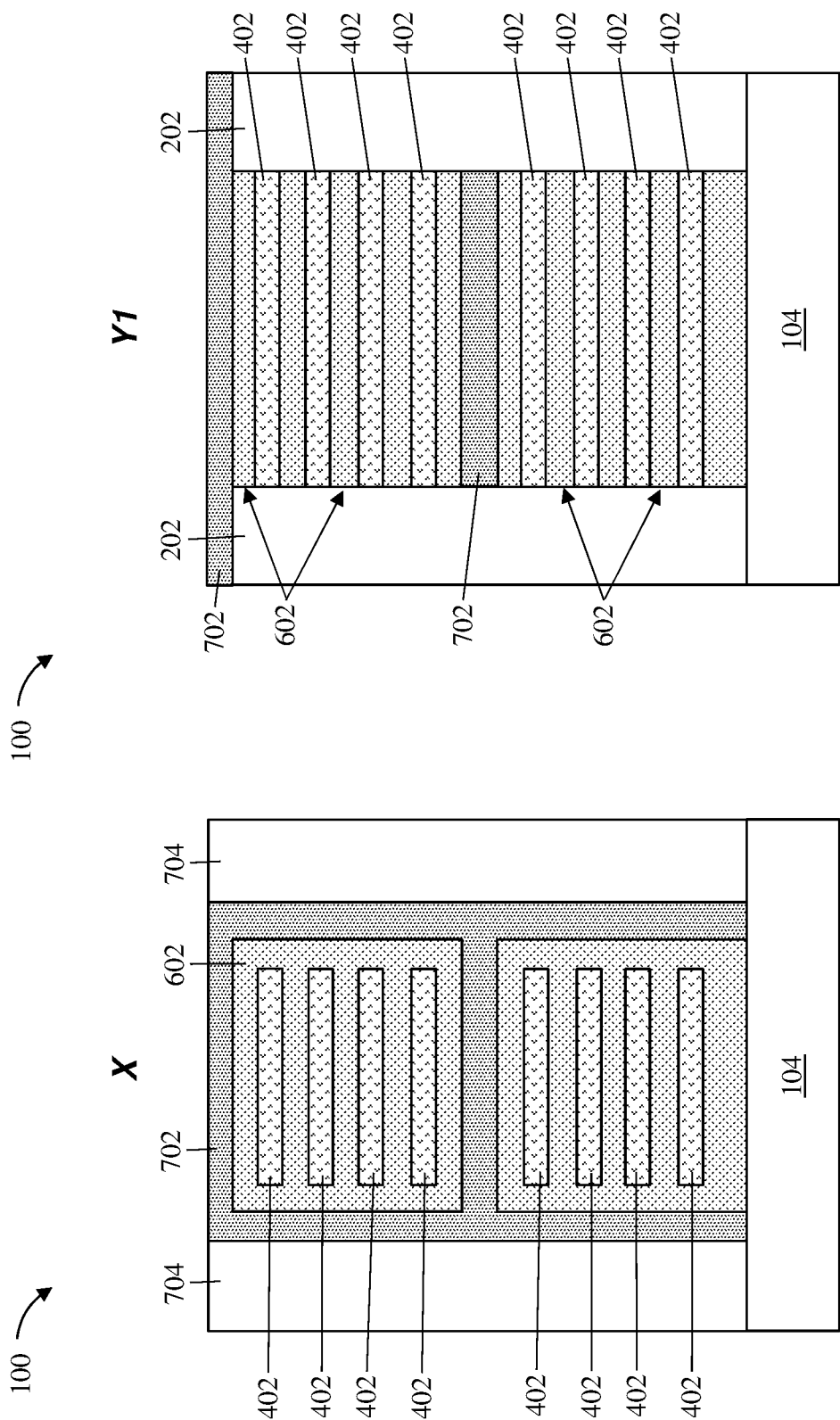
FIG. 7A depicts a cross-sectional view of a semiconductor structure along the line X of the reference view according to one or more embodiments of the invention.
FIG. 7B depicts a cross-sectional view of a semiconductor structure along the line Y1 of the reference view according to one or more embodiments of the invention.

FIGS. 7A and 7B depict cross-sectional views of the semiconductor structure 100 taken along the lines X and Y1 of the reference view 101 after a processing operation according to one or more embodiments of the invention. As shown in the cross-sectional view X of FIG. 7A, an isolation dielectric 702 is formed over dielectric layer 602. Notably, the isolation dielectric 702 fills the remaining space (defined by the stack separation distance) between the first portion 502 and the second portion 504 of the semiconductor layers 402. In this manner, the isolation dielectric 702 serves to electrically isolate the first portion 502 from the second portion 504, allowing these portions to later serve as separate FETs (see, e.g., FIG. 14). Moreover, the isolation dielectric 702 surrounds the semiconductor layers 402 but is physically separated from those layers due to the presence of the dielectric layer 602. Consequently, the isolation dielectric 702 serves as a dielectric shell which advantageously ensures a uniform gate stack during downstream RMG processes (i.e., uniform space for gate dielectric and gate work function metal around nanosheets 402 when the dielectric layer 602 is replaced by gate dielectric and gate work function metals as described with respect to FIG. 13).

In some embodiments of the invention, a shallow trench isolation (STI) 704 is formed over remaining portions of the substrate 104. The STI 704 can be made of any suitable isolation material, such as, for example, silicon nitride, silicon oxide, SiON, SiC, SiOCN, and SiBCN. In some embodiments of the invention, the semiconductor structure 100 is planarized, using, for example, a chemical-mechanical planarization (CMP) process.

Figure 8:
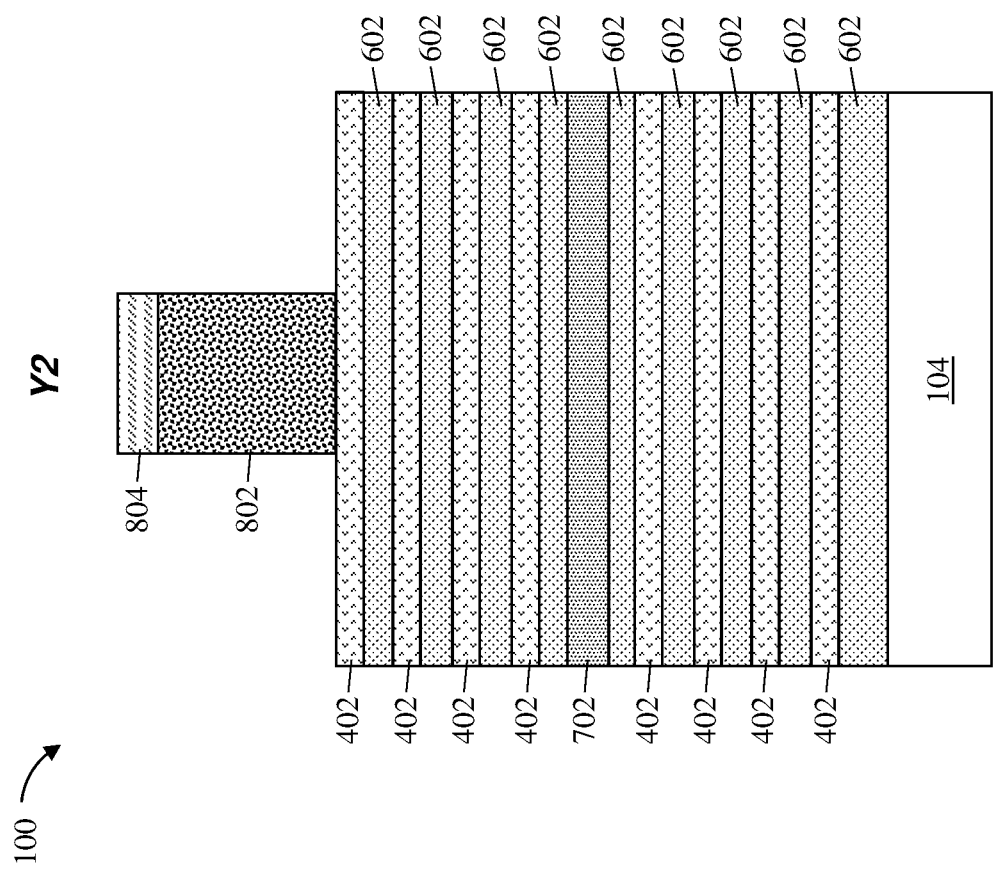
FIG. 8 depicts a cross-sectional view of a semiconductor structure along the line Y of the reference view according to one or more embodiments of the invention.

FIG. 8 depicts a cross-sectional view of the semiconductor structure 100 taken along the line Y2 of the reference view 101 after a processing operation according to one or more embodiments of the invention. In some embodiments of the invention, sidewalls of the nanosheet stacks 102 are revealed (exposed) and a sacrificial gate 802 (sometimes referred to as a dummy gate) is formed over the nanosheet stacks 102.

The portion of a nanosheet stack over which a gate is formed is referred to as a channel region. The sacrificial gate 802 can be made of any suitable material, such as, for example, amorphous silicon or polysilicon. Any known method for patterning a sacrificial gate can be used, such as, for example, a wet etch, a dry etch, or a combination of sequential wet and/or dry etches.

In some embodiments of the invention, a hard mask 804 is formed on the sacrificial gate 802. In some embodiments of the invention, the sacrificial gate 802 is formed by patterning the hard mask 804 and using a wet or dry etch process to selectively remove portions of the sacrificial gate 802 which are not covered by the pattered hard mask 804. The hard mask 804 can be made of any suitable material, such as, for example, a silicon nitride. In some embodiments of the invention, a second hard mask (not depicted) is formed on the hard mask 804 to form a bilayer hard mask. In some embodiments, the second hard mask includes an oxide, such as, for example, silicon dioxide.

Figure 9:
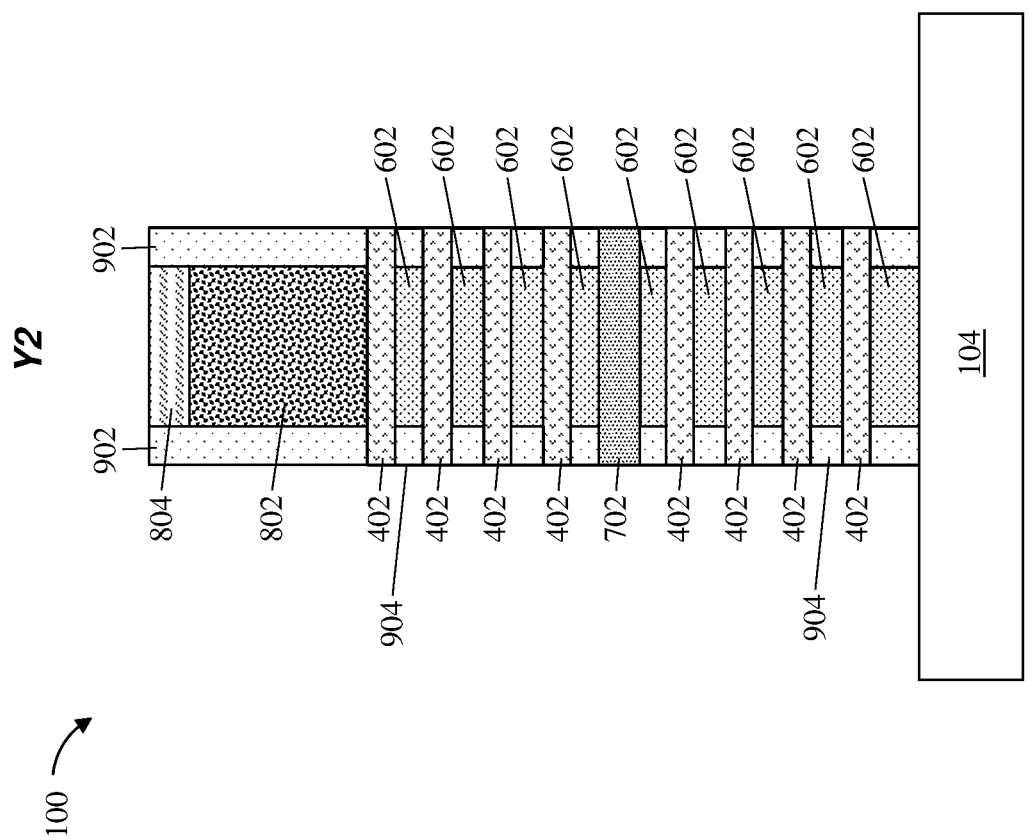
FIG. 9 depicts a cross-sectional view of a semiconductor structure along the line Y of the reference view according to one or more embodiments of the invention.

FIG. 9 depicts a cross-sectional view of the semiconductor structure 100 taken along the line Y2 of the reference view 101 after a processing operation according to one or more embodiments of the invention. In some embodiments of the invention, spacers 902 (also known as sidewall spacers or gate spacers) are formed on sidewalls of the sacrificial gate 802. In some embodiments of the invention, the spacers 902 are formed using CVD, PECVD, UHVCVD, RTCVD, MOCVD, LPCVD, LRPCVD, ALD, PVD, chemical solution deposition, MBE, or other like process in combination with a wet or dry etch process. For example, spacer material can be conformally deposited over the semiconductor structure 100 and selectively removed using a RIE to form the spacers 902.

The spacers 902 can be made of any suitable material, such as, for example, a low-k dielectric, a nitride, silicon nitride, silicon oxide, SiON, SiC, SiOCN, or SiBCN. In some embodiments of the invention, the spacers 902 include silicon nitride. The spacers 902 can be formed to a thickness of about 5 to 40 nm, although other thicknesses are within the contemplated scope of the invention.

In some embodiments of the invention, portions of the nanosheet stacks 102 can be removed (sometimes referred to as a stack recess) to expose a surface of the substrate 104 (or a buried oxide layer if present). The nanosheet stacks 102 can be patterned using, for example, a wet etch, a dry etch, or a combination of wet and/or dry etches. In some embodiments of the invention, the nanosheet stacks 102 are patterned using a RIE. In some embodiments of the invention, the nanosheet stacks 102 are patterned selective to the spacers 902.

In some embodiments of the invention, the dielectric layer 602 can be recessed and inner spacers 904 can be formed on the recessed sidewalls of the dielectric layer 602. For example, sidewalls of the dielectric layer 602 can be recessed to form cavities (not shown) in the nanosheet stacks 102. In some embodiments of the invention, the inner spacers 904 are formed on recessed sidewalls of the dielectric layer 602 by filling these cavities with dielectric material. In some embodiments of the invention, portions of the inner spacers 904 that extend beyond sidewalls of the nanosheet stack 102 are removed, using, for example, an isotropic etching process. In this manner, sidewalls of the inner spacers 904 are coplanar to sidewalls of the semiconductor layers 402. In some embodiments of the invention, the inner spacers 904 are formed using a CVD, PECVD, ALD, PVD, chemical solution deposition, or other like processes in combination with a wet or dry etch process. The inner spacers 904 can be made of any suitable material, such as, for example, a low-k dielectric, a nitride, silicon nitride, silicon dioxide, SiON, SiC, SiOCN, or SiBCN.

Figure 10:
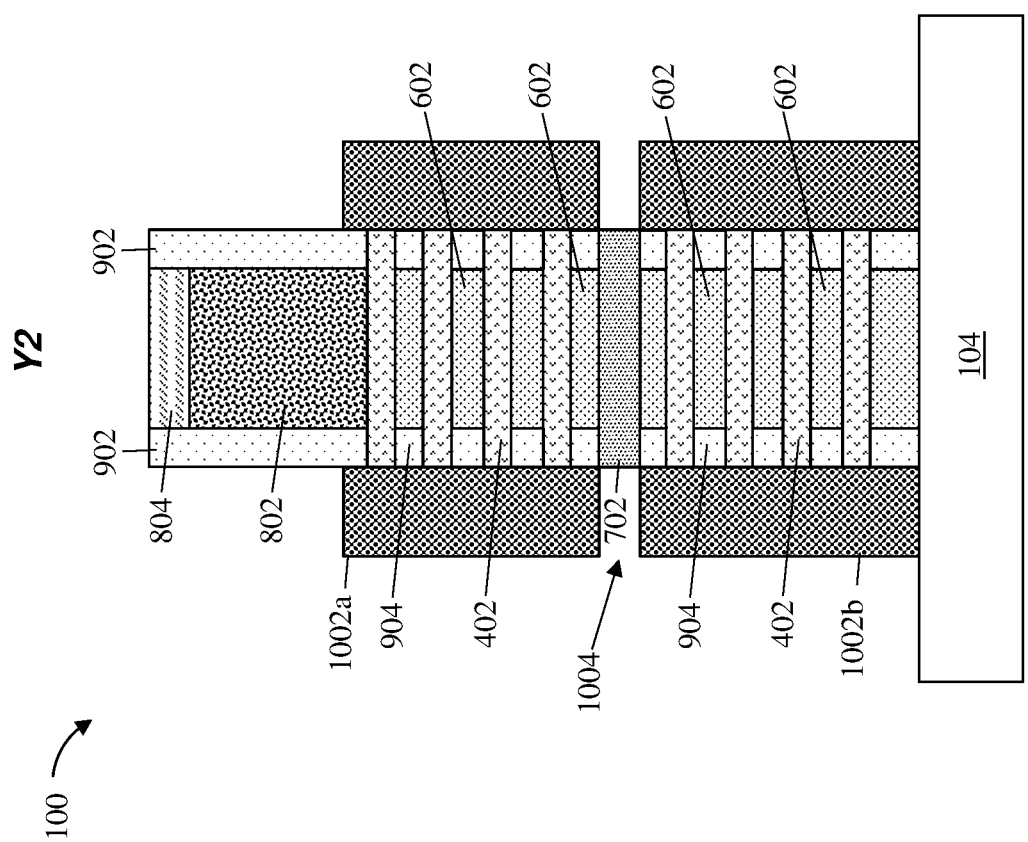
FIG. 10 depicts a cross-sectional view of a semiconductor structure along the line Y of the reference view according to one or more embodiments of the invention.

FIG. 10 depicts a cross-sectional view of the semiconductor structure 100 taken along the line Y2 of the reference view 101 after a processing operation according to one or more embodiments of the invention. In some embodiments of the invention, source and drain regions 1002 are formed on exposed sidewalls of the semiconductor layers 402. In some embodiments of the invention, a gap 1004 remains between upper (1002a) and lower (1002b) portions of the source and drain regions 1002 due to the presence of the isolation dielectric 702, which does not provide a surface for epitaxial growth. The gap 1004 can be later filled (see, e.g., FIG. 11) with dielectrics to ensure device isolation.

The source and drain regions 1002 can be epitaxially grown using, for example, vapor-phase epitaxy (VPE), molecular beam epitaxy (MBE), liquid-phase epitaxy (LPE), or other suitable processes. The source and drain regions 1002 can be semiconductor materials epitaxially grown from gaseous or liquid precursors. In some embodiments of the invention, the gas source for the epitaxial deposition of semiconductor material includes a silicon containing gas source, a germanium containing gas source, or a combination thereof. For example, a silicon layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A silicon germanium alloy layer can be epitaxially formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxially grown silicon and silicon germanium can be doped by adding n-type dopants (e.g., P or As) or p-type dopants (e.g., Ga, B, $BF_2$, or Al). In some embodiments of the invention, the source and drain regions 1002 can be epitaxially formed and doped by a variety of methods, such as, for example, in-situ doped epitaxy (doped during deposition), doped following the epitaxy, or by implantation and plasma doping. The dopant concentration in the doped regions can range from $1\times10^{19}$ $cm^{-3}$ to $2\times10^{21}$ $cm^{-3}$, or between $1\times10^{20}$ $cm^{-3}$ and $1\times10^{21}$ $cm^{-3}$.

In some embodiments of the invention, the source and drain regions 1002 are made of silicon or silicon germanium. In some embodiments of the invention, the source and drain regions 1002 are p-type source/drain regions made of silicon germanium doped with boron to a boron concentration of about 1 to about 15 percent, for example, 2 percent, although other boron concentrations are within the contemplated scope of the invention.

Figure 11:
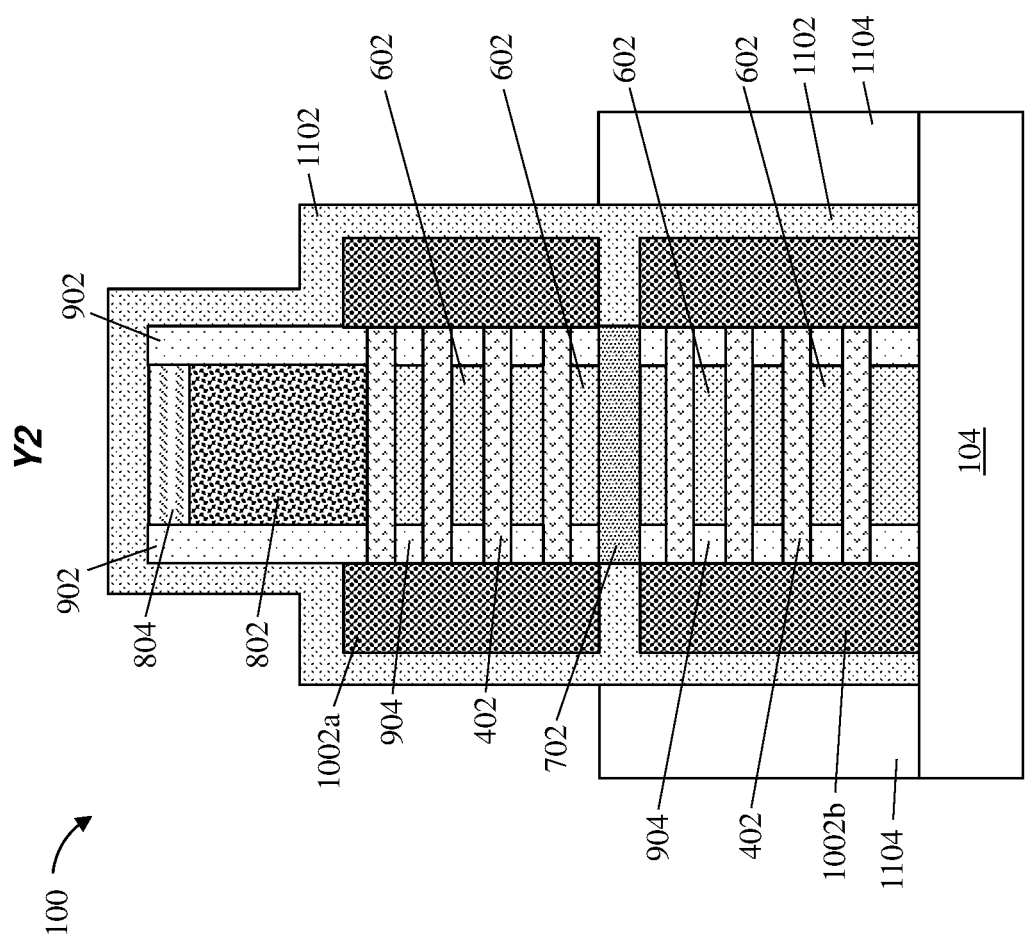
FIG. 11 depicts a cross-sectional view of a semiconductor structure along the line Y of the reference view according to one or more embodiments of the invention.

FIG. 11 depicts a cross-sectional view of the semiconductor structure 100 taken along the line Y2 of the reference view 101 after a processing operation according to one or more embodiments of the invention. In some embodiments of the invention, a liner 1102 is formed over the source and drain regions 1002. In some embodiments of the invention, the liner 1102 fills the gap 1004 (i.e., makes contact with sidewalls of the isolation dielectric 702).

In some embodiments of the invention, the liner 1102 is conformally deposited over the semiconductor structure 100. In some embodiments of the invention, the liner 1102 has a thickness sufficient to completely fill the gap 1004, for example, of about 10 nm to about 60 nm, although other thicknesses are within the contemplated scope of the invention.

In some embodiments of the invention, the liner 1102 is formed using chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, molecular beam epitaxy (MBE), or other like process in combination with a wet or dry etch process. The liner 1102 can be made of any suitable dielectric material, for example, silicon nitride, although other materials are within the contemplated scope of the invention.

As further shown in FIG. 11, an interlayer dielectric (ILD) 1104 is formed over the substrate 104. The ILD 1104 can be made of any suitable dielectric material, such as, for example, oxides, a low-k dielectric, nitrides, silicon nitride, silicon oxide, SiON, SiC, SiOCN, and SiBCN. In some embodiments of the invention, the ILD 1104 is deposited over the semiconductor structure 100 and then recessed to expose the top portion 1002a of the source and drain regions 1002 (as shown). In some embodiments of the invention, the ILD 1104 is recessed selective to the liner 1102.

Figure 12:
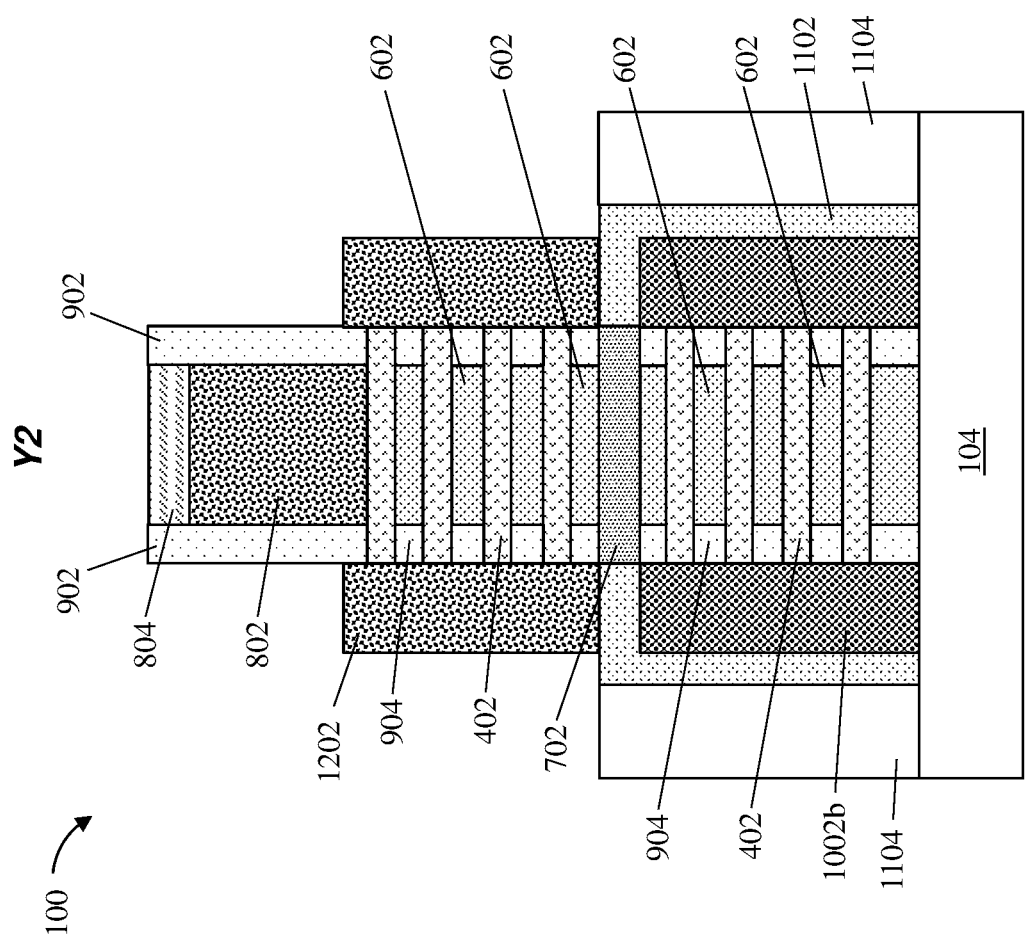
FIG. 12 depicts a cross-sectional view of a semiconductor structure along the line Y of the reference view according to one or more embodiments of the invention.

FIG. 12 depicts a cross-sectional view of the semiconductor structure 100 taken along the line Y2 of the reference view 101 after a processing operation according to one or more embodiments of the invention. In some embodiments of the invention, exposed portions (e.g., those portions above the isolation dielectric 702) of the liner 1102 are removed to expose a surface of the top portion 1002a of the source and drain regions 1002. In some embodiments of the invention, the liner 1102 is removed selective to the ILD 1104 and/or the spacers 902. The liner 1102 can be selectively removed using a wet etch, a dry etch, or a combination of wet and/or dry etches.

Once exposed, the top portion 1002a of the source and drain regions 1002 are removed and replaced with source and drain regions 1202. The top portion 1002a of the source and drain regions 1002 can be removed using, for example, hydrogen chloride (HCl) gas, or an aqueous solution containing a mix of ammonia and hydrogen peroxide. Once removed, the source and drain regions 1202 can be formed on the sidewalls of the semiconductor layers 402 in a similar manner as the source and drain regions 1002. For example, the source and drain regions 1202 can be epitaxially grown from the sidewalls of the semiconductor layers 402.

In some embodiments of the invention, the source and drain regions 1202 have an opposite doping type than the source and drain regions 1002. For example, in embodiments where the source and drain regions 1002 are p-type regions such as silicon germanium doped with boron (SiGe: B), the source and drain regions 1202 can include n-type regions such as silicon doped with phosphorus (Si:P). Similarly, when the source and drain regions 1002 are n-type regions the source and drain regions 1202 can be p-type regions. The dopant concentration can range from about 1 to about 15 percent, for example, 2 percent, although other dopant concentrations are within the contemplated scope of the invention.

Figure 13:
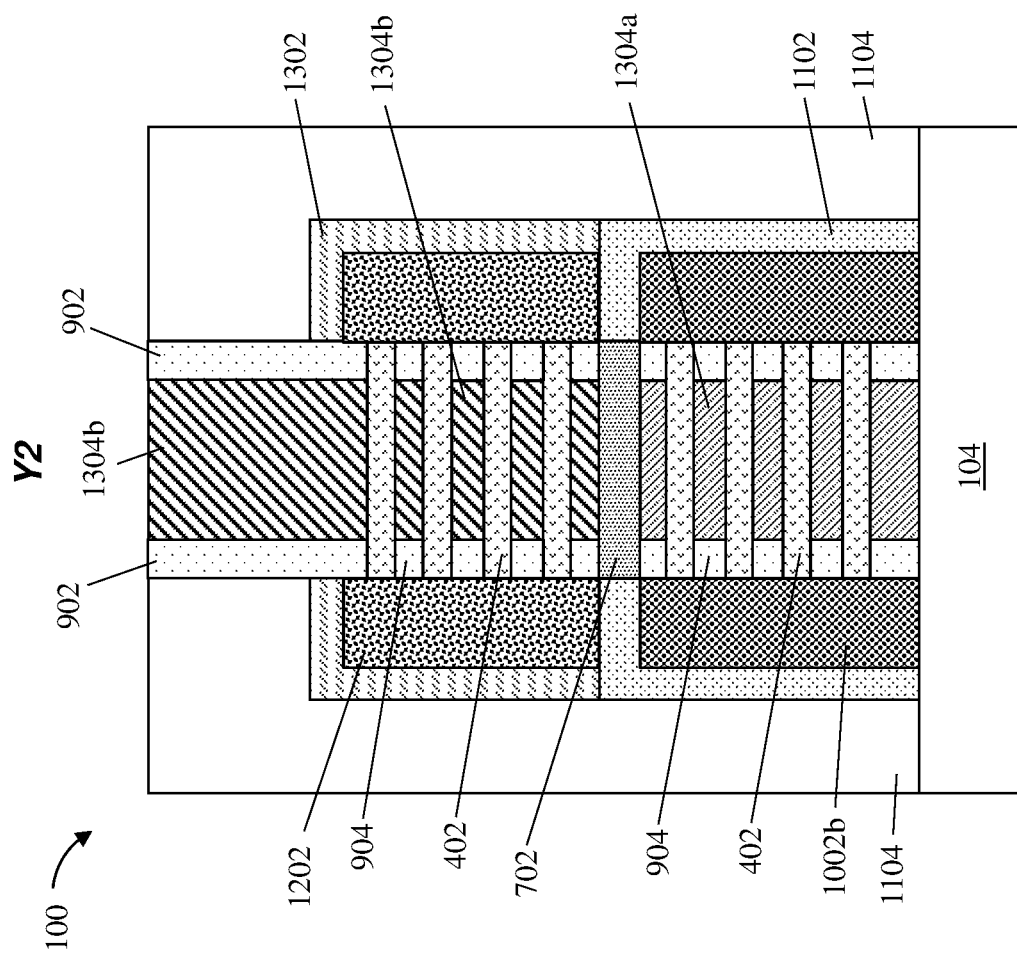
FIG. 13 depicts a cross-sectional view of a semiconductor structure along the line Y of the reference view according to one or more embodiments of the invention.

FIG. 13 depicts a cross-sectional view of the semiconductor structure 100 taken along the line Y2 of the reference view 101 after a processing operation according to one or more embodiments of the invention. In some embodiments of the invention, a liner 1302 is formed over the source and drain regions 1202. The liner 1302 can be formed in a similar manner and from similar materials as the liner 1102. The liner 1302 can be made of the same or different dielectrics than the liner 1102.

In some embodiments of the invention, the height of the ILD 1104 is increased by depositing additional dielectrics over the semiconductor structure 100. In some embodiments of the invention, the ILD 1104 is planarized, using, for example, CMP. In some embodiments of the invention, the ILD 1104 is planarized to a surface of the spacers 902.

As further shown in FIG. 13, the hard mask 804, the sacrificial gate 802, and the dielectric layer 602 are removed to release the semiconductor layers 402 (not separately shown). The hard mask 804, the sacrificial gate 802, and the dielectric layer 602 can then be replaced with an active gate 1304 (sometimes referred to as metal gates or conductive gates). In some embodiments of the invention, the gate 1304 includes a first portion 1304a and a second portion 1304b (as shown).

The gate 1304 can be a high-k metal gate (HKMG) formed over channel regions of the nanosheet stacks 102 using, for example, known replacement metal gate (RMG) processes, or so-called gate-first processes. As used herein, the "channel region" refers to the portion of the semiconductor layers 402 over which the gate 1304 is formed, and through which a current passes from source to drain in the final device.

In some embodiments of the invention, the first portion 1304a of the gate 1304 includes a PFET gate stack and the second portion 1304b of the gate 1304 includes an NFET gate stack (or vice versa). For example, the first portion 1304a and the second portion 1304b of the gate 1304 can include known gate dielectric(s) (not shown) and known work function metal stacks (not shown) appropriate for NFET or PFET devices.

In some embodiments of the invention, the gate dielectric is a high-k dielectric film formed on a surface (sidewall) of the semiconductor layers 402. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of the invention.

In some embodiments of the invention, one or more work function layers are positioned between the high-k dielectric film and a bulk gate material. In some embodiments of the invention, the gate 1304 includes one or more work function layers, but does not include a bulk gate material.

If present, the work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layers can serve to modify the work function of the gate 1304 and enables tuning of the device threshold voltage. The work function layers can be formed to a thickness of about 0.5 to 6 nm, although other thicknesses are within the contemplated scope of the invention. In some embodiments of the invention, each of the work function layers can be formed to a different thickness.

In some embodiments, the gate 1304 includes a main body formed from bulk conductive gate material(s) deposited over the work function layers and/or gate dielectrics. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive gate material can further include dopants that are incorporated during or after deposition.

Figure 14:
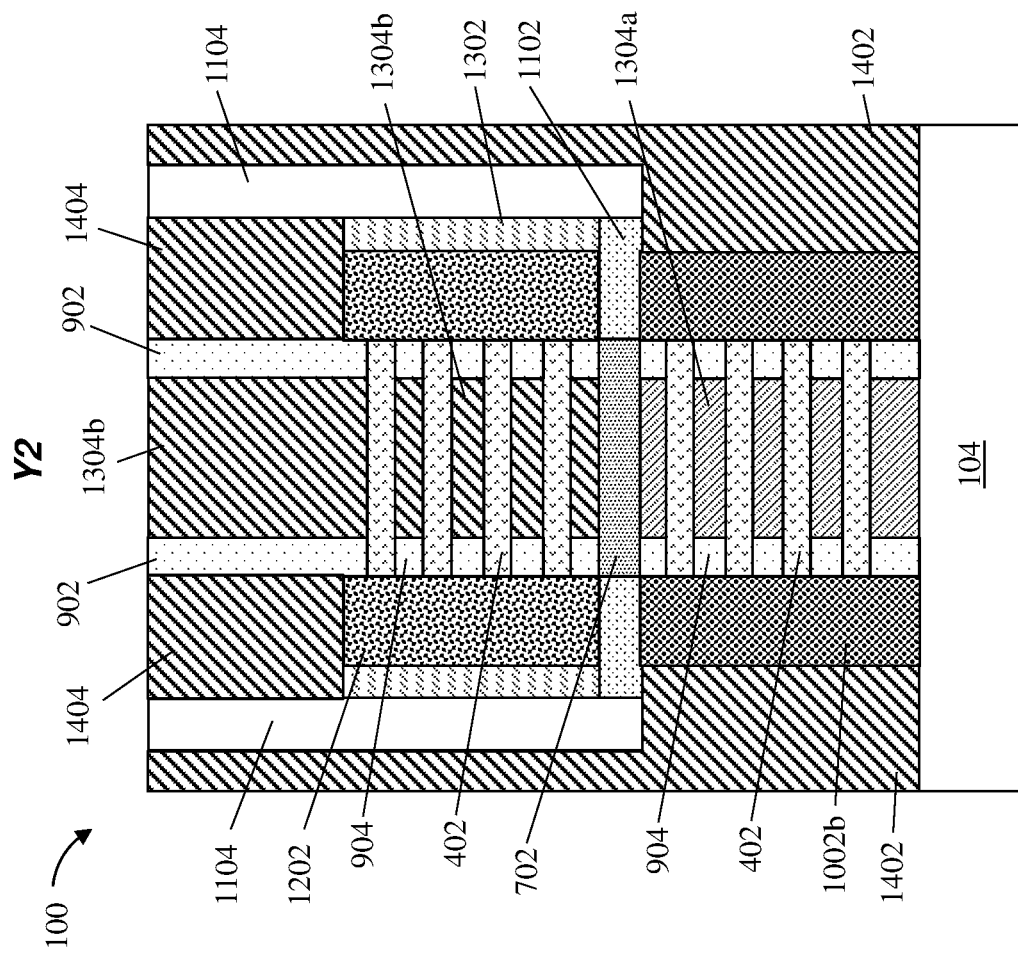
FIG. 14 depicts a cross-sectional view of a semiconductor structure along the line Y of the reference view according to one or more embodiments of the invention.

FIG. 14 depicts a cross-sectional view of the semiconductor structure 100 taken along the line Y2 of the reference view 101 after a processing operation according to one or more embodiments of the invention. In some embodiments of the invention, portions of the ILD 1104 are removed (patterned) to form source/drain contact trenches (not shown) which can be filled with conductive material. In some embodiments of the invention, the source/drain contact trenches expose surfaces of the source and drain regions 1002b and 1202. The ILD 1104 can be patterned using a wet etch, a dry etch, or a combination of sequential wet and/or dry etches.

In some embodiments of the invention, bottom source/drain contacts 1402 are formed in or deposited into the source/drain contact trenches to make electrical contact with the source and drain regions 1002b. Similarly, top source/drain contacts 1404 are formed in or deposited into the source/drain contact trenches to make electrical contact with the source and drain regions 1202.

The source/drain contacts 1402/1404 can be formed from conductive materials that include copper or a non-copper metal (e.g., tungsten, titanium, tantalum, ruthenium, zirconium, cobalt, aluminum, platinum), alloys thereof, conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the source/drain contacts 1402/1404 are formed of a same conductive material, for example, cobalt, copper, ruthenium, or tungsten. In some embodiments of the invention, the source/drain contacts 1402/1404 are made of different conductive materials. In some embodiments of the invention, the source/drain contacts 1402/1404 each include a barrier liner (sometimes referred to as a metal liner, or barrier metal liner) to prevent diffusion into surrounding dielectrics (not shown).

Figure 15:
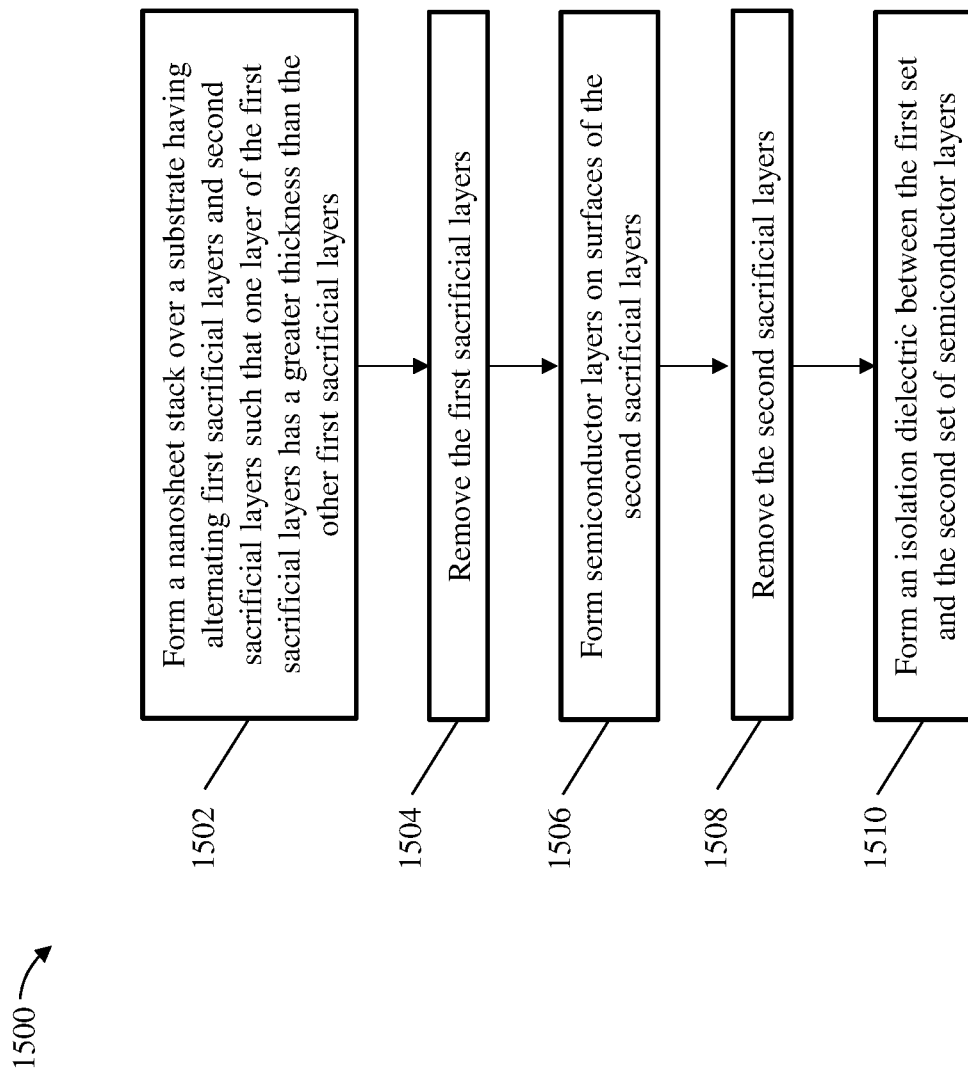
FIG. 15 depicts a flow diagram illustrating a method according to one or more embodiments of the invention.

FIG. 15 depicts a flow diagram 1500 illustrating a method for forming a semiconductor device according to one or more embodiments of the invention. As shown at block 1502, a nanosheet stack is formed over a substrate. The nanosheet stack can include alternating first sacrificial layers and second sacrificial layers. In some embodiments of the invention, the first sacrificial layers include silicon and the second sacrificial layers include silicon germanium. In some embodiments of the invention, a maximum thickness of the second sacrificial layers is below a critical thickness for defects.

In some embodiments of the invention, one layer of the first sacrificial layers is formed to a greater thickness than the remaining first sacrificial layers. In some embodiments of the invention, the one layer having the greater thickness is a middle-most layer of the first sacrificial layers.

At block 1504, the first sacrificial layers are removed to expose surfaces of the second sacrificial layers. At block 1506, semiconductor layers are formed on the exposed surfaces of the second sacrificial layers. The semiconductor layers include a first set and a second set of semiconductor layers. In some embodiments of the invention, the semiconductor layers are epitaxially grown from the exposed surfaces of the second sacrificial layers.

At block 1508, the second sacrificial layers are removed. At block 1510, an isolation dielectric is formed between the first set and the second set of semiconductor layers. The method can further include forming a dielectric layer on exposed surfaces of the semiconductor layers.

In some embodiments of the invention, first source and drain regions are formed on sidewalls of the first set of semiconductor layers and second source and drain regions are formed on sidewalls of the second set of semiconductor layers. In some embodiments of the invention, the first source and drain regions include a first dopant type and the second source and drain regions comprise a second, different dopant type. In some embodiments of the invention, the first source and drain regions include a p-type dopant and the second source and drain regions include an n-type dopant.

In some embodiments of the invention, a first dielectric liner is formed over the first source and drain regions and a second dielectric liner is formed over the second source and drain regions. In some embodiments of the invention, the second dielectric liner is formed directly on a top surface of the first dielectric liner.

In some embodiments of the invention, bottom source and drain contacts are formed on sidewalls of the first source and drain regions. In some embodiments of the invention, top source and drain contacts are formed on a top surface of the second source and drain regions.

In some embodiments of the invention, a gate is formed over channel regions of the semiconductor layers. In some embodiments of the invention, the gate includes a first portion and a second portion. In some embodiments of the invention, the first portion includes a p-type gate stack and the second portion includes an n-type gate stack.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a <100> orientated crystalline surface can take on a <100> orientation. In some embodiments of the invention of the invention, epitaxial growth and/or deposition processes can be selective to forming on semiconductor surface, and may or may not deposit material on other exposed surfaces, such as silicon dioxide or silicon nitride surfaces.

As used herein, "p-type" refers to the addition of impurities to an intrinsic semiconductor that creates deficiencies of valence electrons. In a silicon-containing substrate, examples of p-type dopants, i.e., impurities, include but are not limited to, boron, aluminum, gallium, and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
    forming a nanosheet stack over a substrate, the nanosheet stack comprising alternating first sacrificial layers and second sacrificial layers, wherein one layer of the first sacrificial layers comprises a greater thickness than the remaining first sacrificial layers;
    removing the first sacrificial layers;
    forming semiconductor layers on surfaces of the second sacrificial layers, wherein the semiconductor layers comprise a first set and a second set of semiconductor layers;
    removing the second sacrificial layers; and
    forming an isolation dielectric between the first set and the second set of semiconductor layers.

2. The method of claim 1, wherein the first sacrificial layers comprise silicon and the second sacrificial layers comprise silicon germanium.

3. The method of claim 1, wherein the one layer having the greater thickness comprises a middle-most layer of the first sacrificial layers.

4. The method of claim 1, wherein a maximum thickness of the second sacrificial layers is below a critical thickness for defects.

5. The method of claim 4, wherein the semiconductor layers are epitaxially grown from exposed surfaces of the second sacrificial layers.

6. The method of claim 1 further comprising forming a dielectric layer on exposed surfaces of the semiconductor layers.

7. The method of claim 1 further comprising forming first source and drain regions on sidewalls of the first set of semiconductor layers and second source and drain regions on sidewalls of the second set of semiconductor layers.

8. The method of claim 7, wherein the first source and drain regions comprise a first dopant type and the second source and drain regions comprise a second dopant type.

9. The method of claim 8, wherein the first source and drain regions comprise a p-type dopant and the second source and drain regions comprise an n-type dopant.

10. The method of claim 7 further comprising forming a first dielectric liner over the first source and drain regions and a second dielectric liner over the second source and drain regions.

11. The method of claim 10, wherein the second dielectric liner is on a top surface of the first dielectric liner.

12. The method of claim 10 further comprising forming bottom source and drain contacts on sidewalls of the first source and drain regions.

13. The method of claim 12 further comprising forming top source and drain contacts on a top surface of the second source and drain regions.

14. The method of claim 1 further comprising forming a gate over channel regions of the semiconductor layers.

15. The method of claim 14, wherein the gate comprises a first portion and a second portion, and wherein the first portion comprises a p-type gate stack and the second portion comprises an n-type gate stack.

\* \* \* \* \*